United States Patent
Landolf

[19]
[11] Patent Number: 5,831,834
[45] Date of Patent: *Nov. 3, 1998

[54] CIRCUIT BOARD WITH DETACHABLE BATTERY

[75] Inventor: David E. Landolf, Beaverton, Oreg.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 548,407

[22] Filed: Oct. 26, 1995

[51] Int. Cl.⁶ .............................. H05K 7/02; B23P 17/00; H01M 2/10
[52] U.S. Cl. ........................... 361/782; 174/260; 174/250; 174/254; 29/413; 361/748; 429/100
[58] Field of Search .................................. 429/1, 96–100, 429/121, 123; 361/728, 737, 760, 777, 779, 782, 807, 809, 811, 748, 749, 792–795; 340/825.54; 439/500; 455/89, 90, 271, 347; 307/127; 29/413, 426.1, 846; 438/460, 462; 257/618; 174/255, 260

[56] References Cited

U.S. PATENT DOCUMENTS

| | | | |
|---|---|---|---|
| 4,216,523 | 8/1980 | Harford | 361/748 |
| 4,619,873 | 10/1986 | Ishikura et al. | 429/100 |
| 5,325,267 | 6/1994 | Ewing | 361/760 |
| 5,471,016 | 11/1995 | Krainer et al. | 174/760 |

*Primary Examiner*—Donald Sparks
*Attorney, Agent, or Firm*—Blakely, Sokoloff, Taylor & Zafman

[57] ABSTRACT

A battery is attached to a circuit board. The circuit board is weakened around a localized area around the battery to allow detachment of the localized area including the battery.

19 Claims, 4 Drawing Sheets

CIRCUIT BOARD WITH DETACHABLE BATTERY

FIELD OF THE INVENTION

The present invention relates to the field of electronics; more particularly, the present invention relates to any circuit board which employs a battery.

BACKGROUND OF THE INVENTION

Many electronic circuit boards employ batteries. While some circuit boards include a battery which is soldered directly to the board, other circuit boards have a battery socket attached to the board to allow for easy insertion and removal of the battery.

One example of battery use in an electronic circuit board is a computer board. Many computers employ a non-volatile memory such as a CMOS memory to maintain configuration data which need to be maintained when the power is taken away from the circuit board. A battery attached to the CMOS memory is one way of supplying a handy data storage means for the use of the computer. Batteries are also used in other electronic equipment such as radios as well as many other electronic items such as those that maintain a clock.

For some electronic equipment, the battery may last only a limited time, and then it must be replaced. An easily accessible and replaceable battery is desirable in this case. For example, a socket can be employed to allow easy replacement of the battery. For other electronic items, the battery may outlast the useful life of the electronic equipment. The battery can be mounted permanently on these types of items.

Due to recent concerns about the possible release of toxic materials from discarded batteries, some regions have started to impose restrictions on the discarding of batteries. For example, in Europe, recent laws have restricted the disposal of batteries such that these batteries must be taken off of a circuit board before the circuit board can be discarded. If the battery has been permanently mounted on the board, for example, by solder, then extra efforts must be made to de-solder the battery from the circuit board prior to discarding the circuit board. Thus, a way of easily removing a battery from a circuit board is desired.

SUMMARY OF THE INVENTION

A method for mounting a battery in an environmentally-friendly way is performed by attaching the battery to a detachable area of a circuit board. The circuit board is predisposed to break around a localized area around the battery such that the localized area can be detached from the circuit board.

BRIEF DESCRIPTION OF THE DRAWINGS

The present invention will be understood more fully from the detailed description given below and from the accompanying drawings of the preferred embodiments of the invention, which, however, should not be taken to limit the invention to the specific embodiments, but are for explanation and understanding only.

DETAILED DESCRIPTION OF THE PRESENT INVENTION

A method and apparatus for mounting a battery to a circuit board is described. In the following detailed description of the present invention numerous specific details are set forth in order to provide a thorough understanding of the present invention. However, it will be obvious to one skilled in the art that the present invention may be practiced without these specific details. In other instances, well-known structures and devices are shown in block diagram form, rather than in detail, in order to avoid unnecessarily obscuring the present invention.

Figure 1:
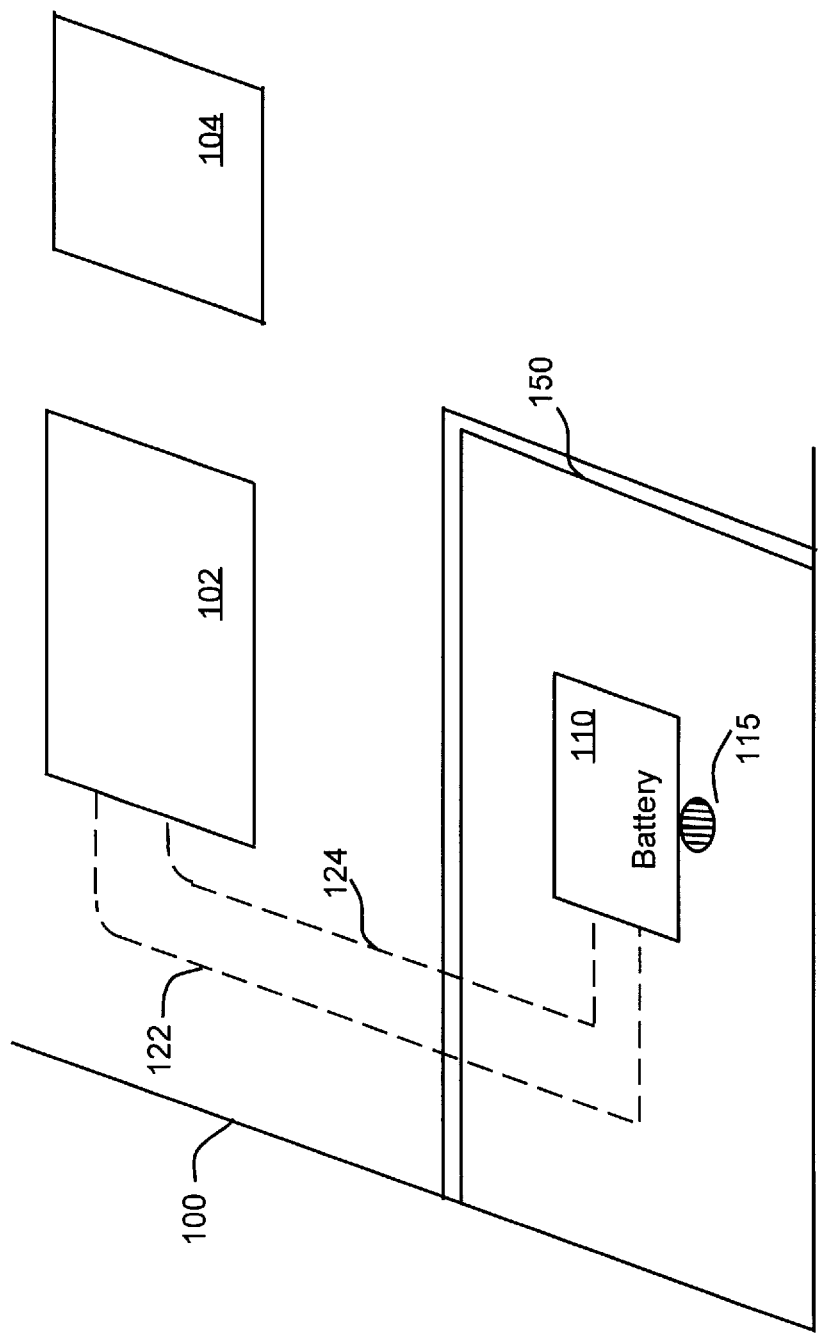
FIG. 1 is a diagram of a circuit board illustrating the present invention.

FIG. 1 shows a circuit board 100 which includes electronic components 102 and 104. A battery 110 is permanently mounted on the circuit board 100 to provide power to the electronic components 102 and 104. In one embodiment, the battery 110 is only coupled to one electronic component 102. In other embodiments, the battery is coupled to multiple electronic components.

In one embodiment the battery 110 is permanently mounted onto the circuit board via an attachment means 115 such as solder. The battery provides power to the electronic component 102 via coupling means 122 and 124 such as traces which run either on top of the circuit board or within the circuit board. In one embodiment, electronic component 102 is not mounted on the circuit board 100, and the battery 110 is coupled to the electronic component 102 via wires which may or may not be attached to the circuit board 100.

Figure 2:
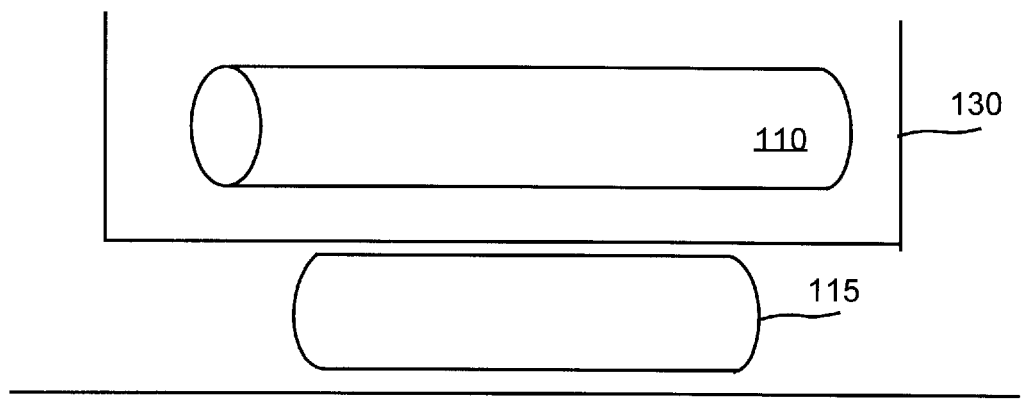
FIG. 2 shows an alternate embodiment for mounting a battery using a battery housing.
Figure 3:
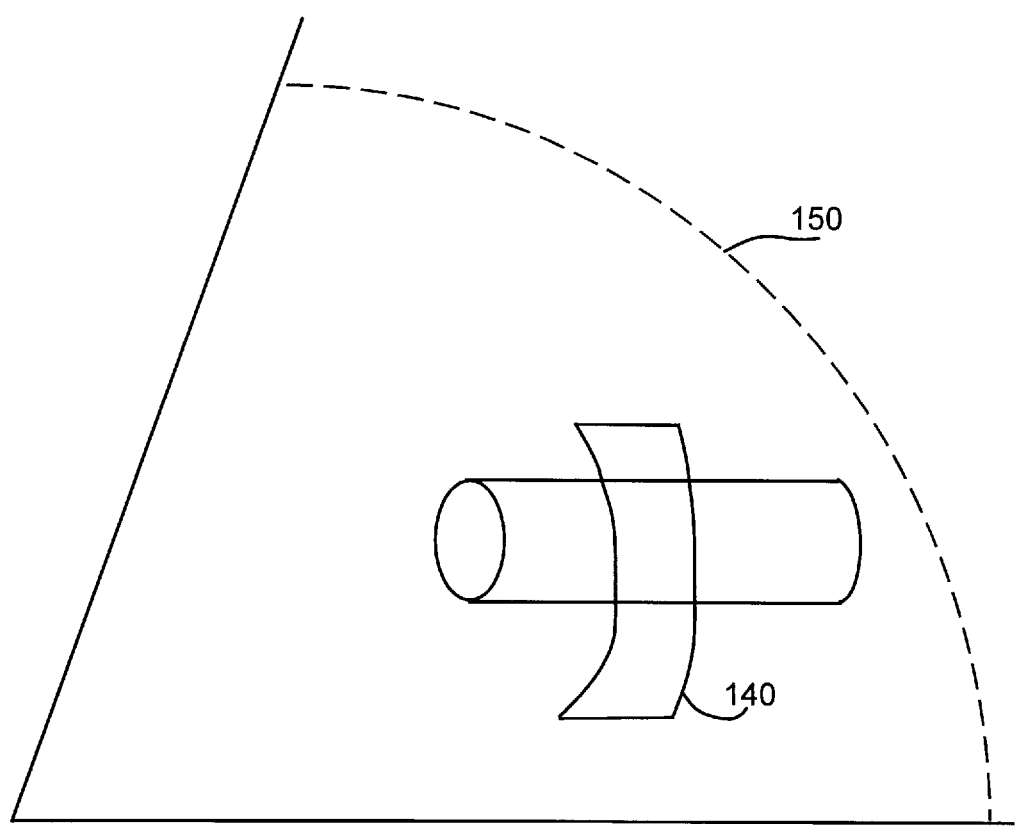
FIG. 3 shows an alternate embodiment for mounting a battery using a clip.

FIG. 2 shows an alternate embodiment for mounting a battery, in which the battery is put in an inexpensive housing 130, and the housing is permanently mounted on the circuit board 100 via an attachment means 115 such as solder, glue, or some other means. In another embodiment, a clip 140 is used to permanently hold the battery to the circuit board, as shown in FIG. 3.

Permanently mounting the battery directly to the circuit board is advantageous for a couple of reasons. First, production costs can be reduced since the expense of a socket or housing can be eliminated by directly mounting the battery. Additionally, the labor cost involved in placing the battery in a socket can also be avoided.

Returning to FIG. 1, the battery is either mounted to a detachable area 150 of the circuit board, or a detachable area 150 is created after the battery has been mounted to the circuit board.

Figure 4:
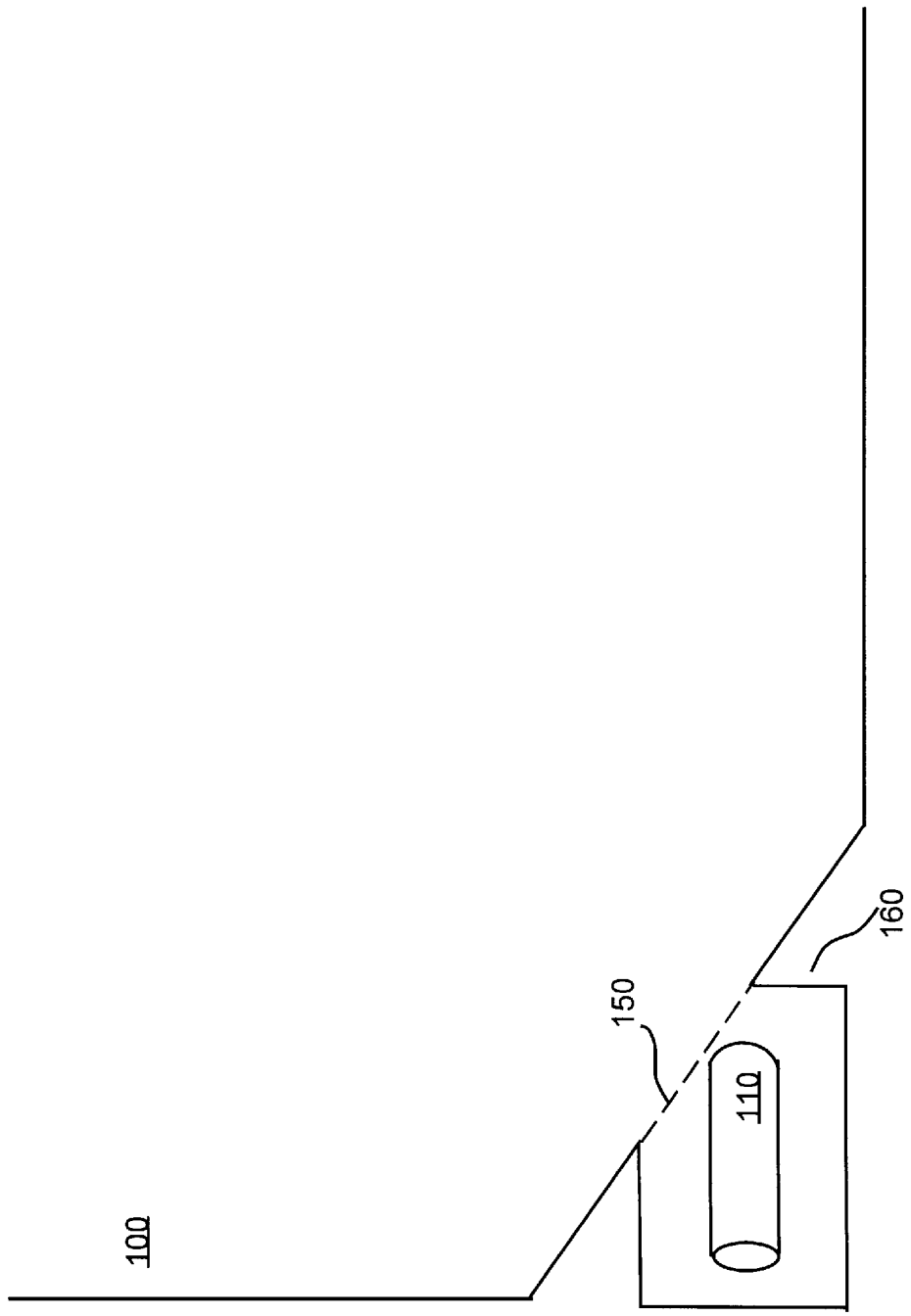
FIG. 4 shows the use of notches to create a detachable area.

The detachable area 150 can be created by a variety of different means including: partially pre-cutting the circuit board, scoring the circuit board, etching the circuit board, or perforating the circuit board. Notches 160 can also be made in the circuit board as shown in FIG. 4.

The detachable area 150 can be located on a corner of the circuit board 100, or it can be in the middle of the circuit board. The detachable area may be formed by a cut in only one direction as shown in FIG. 3, which shows a triangular detachable area 150, or the detachable area may be formed by cuts in two directions as shown in FIG. 1, to form a rectangular detachable area. More cuts may be required if the detachable area 150 is located in the middle of the circuit board.

Figure 5:
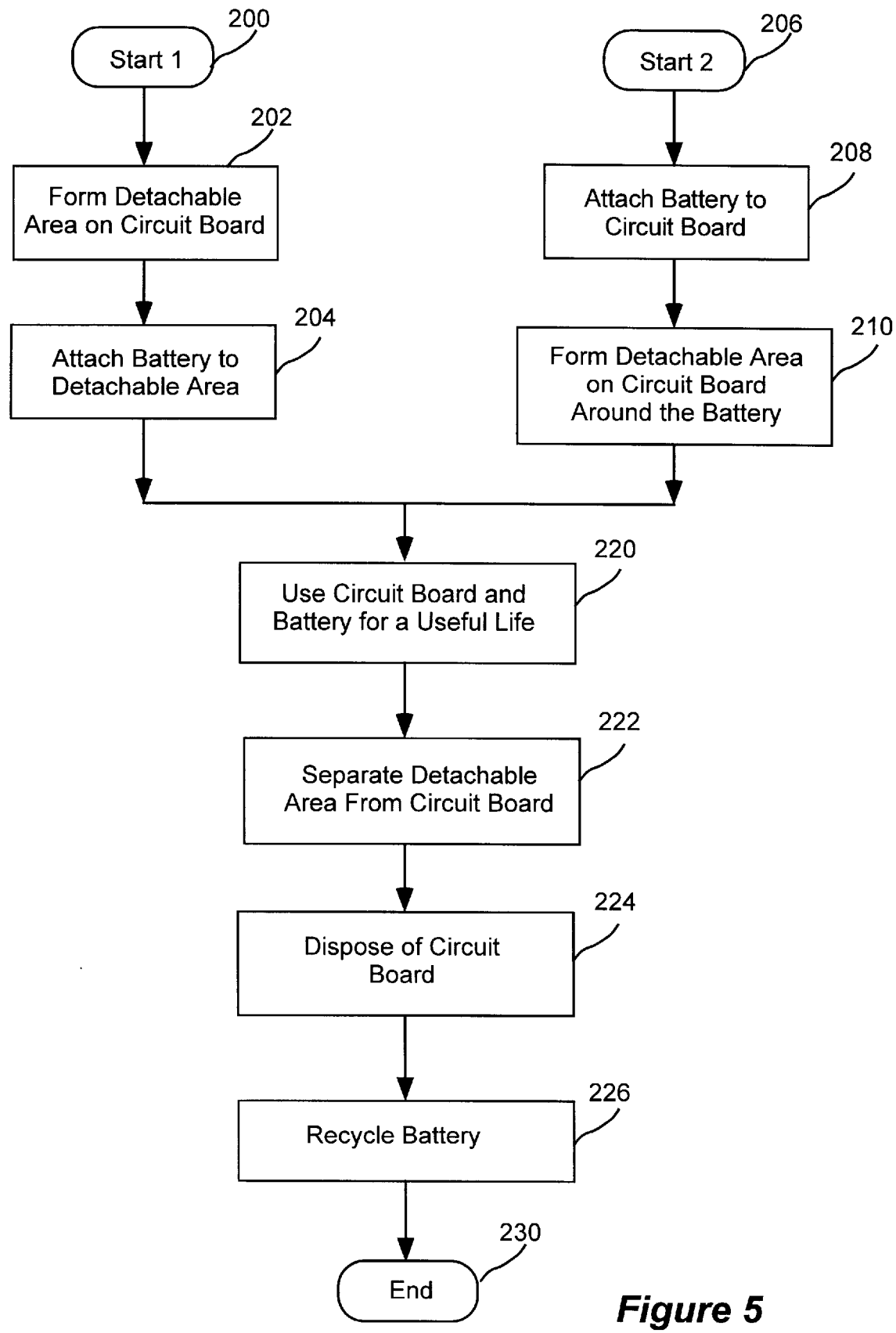
FIG. 5 is a flow diagram showing the use of the present invention.

FIG. 5 shows a flow diagram of the invention. The flow diagram starts at either the flow block 200 or the flow block

206, illustrating two distinct methods of implementing the present invention.

From the flow block 200, the flow diagram proceeds to block 202, at which the detachable area 150 is formed on the circuit board 100. The detachable area is formed by various means including partially pre-cutting the circuit board, scoring the circuit board, etching the circuit board, perforating the circuit board, or other means of predisposing the circuit board to allow the detachable area to be broken off without needing to apply excess force. Partially pre-cutting the circuit board may entail cutting through one or more layers of the circuit board but allowing other layers of the circuit board which have traces to remain intact. The battery is then attached to the detachable area 150 at block 204.

From the alternate starting flow block 206, the flow diagram proceeds to block 208, at which the battery is attached to the circuit board 100. A detachable area is then created around the battery at block 210 in a way similar to that described in flow block 202. It will often be easier and cheaper to form the detachable area prior to attaching the battery as shown by blocks 202 and 204, but the alternative method shown in blocks 208 and 210 may also be used.

From blocks 204 and 210, the flow diagram proceeds at block 220, at which the circuit board and battery are used for the useful life of the circuit board. The detachable area is separated from the rest of the circuit board at block 222. This may be accomplished by breaking the detachable area off from the circuit board 100. Breaking the detachable area off from the rest of the circuit board is a simple cost effective method of removing the battery instead of having to desolder the battery or unmount the battery via other means.

The circuit board 100 may then be disposed of at block 224, and the battery may be recycled at block 226. The flow diagram ends at block 230.

Thus, an apparatus and method for mounting a battery to a circuit board is disclosed. The specific arrangements and methods described herein are merely illustrative of the principles of this invention. Numerous modifications in form and detail may be made without departing from the scope of the described invention. Although this invention has been shown in relation to a particular embodiment, it should not be considered so limited. Rather, the described invention is limited only by the scope of the appended claims.

What is claimed is:

1. A method of mounting a non-rechargeable battery to a multi-layer circuit board having outer layer(s) and inner layer(s), the method comprising the steps of:
   (a) predisposing the circuit board to break around a localized area of the circuit board by removing the outer layer(s) of the circuit board along a line defining the localized area of the circuit board leaving the inner layer(s); and
   (b) attaching the non-rechargeable battery to the localized area of the circuit board to provide power to a data storage component through traces running from the rechargeable battery to the data storage component wherein the traces running from the rechargeable battery to the data storage component pass through the inner layer(s) of the circuit board when traversing the line defining the localized area of the circuit board.

2. The method of claim 1 further including the step of:
   (c) detaching the localized area from the circuit board.

3. The method of claim 1, wherein step further comprises removing the inner layer(s) at select points along the line defining the localized area such that the line defining the localized area is perforated.

4. The method of claim 1 further including the step of:
   providing power to a data storage component for storing BIOS information.

5. The method of claim 2 wherein the circuit board has a useful life, and the step of detaching the localized area from the circuit board is performed after the useful life of the circuit board is over.

6. A circuit board comprising:
   a fiberglass board having outer layer(s) and inner layer(s), the fiberglass circuit board including a detachable area wherein the outer layer(s) along a line defining the detachable area are removed leaving only the inner layer(s);
   a data storage component mounted to the fiberglass board; and
   a rechargeable battery, mounted to the fiberglass circuit board within the detachable area, wherein the rechargeable battery is coupled to the data storage component via traces which traverse the line defining the detachable area through the inner layer(s) of the fiberglass board.

7. The circuit board of claim 6 wherein the fiberglass board is partially pre-cut to form the detachable area.

8. The circuit board of claim 6 wherein the fiberglass board is a circuit board of a computer system.

9. The circuit board of claim 6 wherein the data storage component is a CMOS memory.

10. The circuit board of claim 6 wherein the fiberglass board is perforated to form the detachable area.

11. The circuit board of claim 6 wherein the non-rechargeable battery is attached in a corner of the fiberglass board.

12. A circuit board having outer layer(s) and inner layer(s), the circuit board comprising:
   a data storage component;
   a battery means, operative to supply power to the data storage component; and
   an adhering means for permanently coupling the battery means to a detachable area of the circuit board defined by a line surrounding the detachable area of the circuit board wherein the outer layer(s) of the circuit board have been removed leaving only the inner layers, wherein the battery means supplies power to the date storage component through traces traversing the line defining the detachable area in the inner layer(s) of the circuit board.

13. The circuit board of claim 12 wherein the adhering means is solder.

14. The circuit board of claim 12 wherein the adhering means is glue.

15. A method of attaching a non-rechargeable battery to a circuit board having outer layer(s) and inner layer(s), the method comprising the steps of:
   (a) attaching the non-rechargeable battery to the circuit board;
   (b) creating a detachable section on the circuit board by removing the outer layer(s) along a line defining the detachable section of the circuit board leaving the inner layer(s), the non-rechargeable battery located on the detachable section; and (c) electrically coupling the non-rechargeable battery to a data storage component on the circuit board through traces traversing the line defining the detachable section of the circuit board in the inner layer(s) of the circuit board.

16. The method of claim 15 wherein the non-rechargeable battery is placed in a mounting prior to attaching the non-rechargeable battery to the detachable section.

17. The method of claim 15 wherein the step (c) of providing power to the data storage component on the circuit board is achieved by providing power to a timing device which maintains time information.

18. The method of claim 15 further comprising the step of:

(d) detaching the detachable section from the circuit board.

19. The method of claim 15 further comprising the step of:

(d) storing configuration information in the data storage component; and (e) detaching the detachable section from the circuit board when the battery has discharged.

* * * * *

UNITED STATES PATENT AND TRADEMARK OFFICE
CERTIFICATE OF CORRECTION

PATENT NO.    : 5,831,834
DATED         : November 3, 1998
INVENTOR(S)   : Landolf It is certified that error appears in the above-identified patent and that said Letters Patent is hereby corrected as shown below:

<u>Column 4,</u>
Line 1, after "step", insert -- (a) --.

Signed and Sealed this

Thirteenth Day of May, 2003

JAMES E. ROGAN
*Director of the United States Patent and Trademark Office*